United States Patent
Reznicek et al.

(10) Patent No.: US 11,114,606 B2
(45) Date of Patent: Sep. 7, 2021

(54) MRAM DEVICES CONTAINING A HARDEN GAP FILL DIELECTRIC MATERIAL

(71) Applicant: International Business Machines Corporation, Armonk, NY (US)

(72) Inventors: Alexander Reznicek, Troy, NY (US); Devika Sil, Rensselaer, NY (US); Oleg Gluschenkov, Tannersville, NY (US); Yasir Sulehria, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 16/579,300

(22) Filed: Sep. 23, 2019

(65) Prior Publication Data

US 2021/0091302 A1   Mar. 25, 2021

(51) Int. Cl.
| | |
|---|---|
| H01L 43/08 | (2006.01) |
| H01L 43/02 | (2006.01) |
| H01L 43/12 | (2006.01) |

(52) U.S. Cl.
CPC ............. *H01L 43/02* (2013.01); *H01L 43/12* (2013.01)

(58) Field of Classification Search
None
See application file for complete search history.

(56) References Cited

U.S. PATENT DOCUMENTS

| | | |
|---|---|---|
| 6,900,121 B1 | 5/2005 | Ngo et al. |
| 7,857,907 B2 | 12/2010 | Cho et al. |
| 8,174,023 B2 | 5/2012 | Chen |
| 2012/0170358 A1 | 7/2012 | Liaw et al. |
| 2013/0288394 A1* | 10/2013 | Kontos ............... H01L 27/222 438/3 |
| 2014/0134852 A1* | 5/2014 | Izawa ............... H01L 21/02348 438/800 |
| 2014/0273502 A1* | 9/2014 | Hatem ................ H01L 43/12 438/758 |
| 2015/0137286 A1* | 5/2015 | Guo ..................... H01L 43/12 257/421 |
| 2016/0126288 A1 | 5/2016 | Guo |
| 2017/0162686 A1 | 6/2017 | Arimura |
| 2017/0288135 A1 | 10/2017 | Chou et al. |
| 2018/0351081 A1 | 12/2018 | Sung et al. |

FOREIGN PATENT DOCUMENTS

CN      108735896 A     11/2018

OTHER PUBLICATIONS

Internatianal Search Report dated Dec. 30, 2020, received in a corresponding application, namely International Application No. PCT/IB2020/058813, 9 pages.

* cited by examiner

*Primary Examiner* — Ali Naraghi
(74) *Attorney, Agent, or Firm* — Scully, Scott, Murphy & Presser, P.C.; Daniel P. Morris, Esq.

(57) ABSTRACT

A harden gap fill dielectric material that has improved chemical and physical properties is formed laterally adjacent to a multilayered magnetic tunnel junction (MTJ) pillar and a top electrode structure of a memory structure. The harden gap fill dielectric material can be formed by introducing, via ion implantation, a bond breaking additive into an as deposited gap fill dielectric material layer and thereafter curing the gap fill dielectric material layer containing the bond breaking additive. The curing includes UV curing alone, or UV curing in combination with laser annealing. The curing employed in the present application does not negatively impact the MTJ pillar or top electrode structure.

18 Claims, 9 Drawing Sheets

MRAM DEVICES CONTAINING A HARDEN GAP FILL DIELECTRIC MATERIAL

BACKGROUND

The present application relates to a memory structure and a method of forming the same. More particularly, the present application relates to a magnetoresistive random access memory (MRAM) structure which contains a harden gap fill dielectric material that has improved chemical and physical properties, and a method of forming the same.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates is a permanent magnetic set to a particular polarity (i.e., a magnetic reference layer); the other plate's magnetization can be changed to match that of an external field to store memory (i.e., a magnetic free layer). Such a configuration is known as a magnetic tunnel junction (MTJ) pillar. In leading-edge or neuromorphic computing systems, a MTJ pillar is typically embedded within a back-end-of-the-line (BEOL) structure.

In the manufacturing of a MRAM device, blanket layers of MTJ pillar materials (i.e., a magnetic reference material, a tunnel barrier, a magnetic free material and a MTJ cap material) and a top electrode material are formed upon a conductive landing pad; the conductive landing pad forms a bottom electrode of the MRAM device. The blanket layers are then patterned by lithography and etching to provide a material stack of a multilayered MTJ pillar (including remaining portions of the magnetic reference material, the tunnel barrier, the magnetic free material, and the MTJ cap material) and a top electrode located on the conductive landing pad. Immediately after the formation of this material stack, a dielectric passivation layer such as, for example, silicon nitride (SiN), is formed to passivate the tunnel barrier. A gap fill dielectric material is then formed that fills in the gaps between neighboring MTJ pillars.

In MRAM device arrays, the gap fill dielectric material needs to have self-planarizing properties. Furthermore, and in current MRAM device processing which includes a deposition-etch-deposition method, the gap fill dielectric material suffers from wafer to wafer variability ranging from the non-uniformities in height of the MTJ pillars. There is thus a need to provide a MRAM device array that includes a self-planarizing gap fill dielectric that also has improved chemical and physical properties in between the MTJ pillars.

SUMMARY

A harden gap fill dielectric material that has improved chemical and physical properties is formed laterally adjacent to a multilayered magnetic tunnel junction (MTJ) pillar and a top electrode structure of a memory structure. The harden gap fill dielectric material can be formed by introducing, via ion implantation, a bond breaking additive into an as deposited gap fill dielectric material layer and thereafter curing the gap fill dielectric material layer containing the bond breaking additive. The curing includes UV curing alone, or UV curing in combination with laser annealing. The curing employed in the present application does not negatively impact the MTJ pillar or top electrode structure.

The harden gap fill dielectric material that is provided in the present application is more etch resistance than an equivalent prior art gap fill dielectric material which is not subjected to modification and curing as outlined in the present application. The presence of the harden gap fill dielectric material in a memory structure containing at least one MTJ pillar and a top electrode structure can provide better via profiles with reduced or no via blowout at the via bottom in an integration flow at multiple interconnect levels.

In one aspect of the present application, a method of forming a memory structure is provided. In one embodiment, the method includes forming a patterned material stack on a surface of a bottom electrode, wherein the patterned material stack includes a multilayered magnetic tunnel junction (MTJ) pillar and a top electrode structure. A gap fill dielectric material layer is then formed laterally adjacent to, and on top of, the patterned material stack. A bond breaking additive is then introduced, via ion implantation, into the gap fill dielectric material layer to provide a modified gap fill dielectric material layer. The modified gap fill material layer is then cured to provide a harden gap fill dielectric material layer.

In the present application, curing is performed using an energy source that is provides electromagnetic radiation. In some embodiments, the curing includes UV curing alone. In other embodiments, the curing includes UV curing and laser annealing. In such an embodiment, the laser annealing can be performed prior to, or after, the UV curing. In some embodiments and when laser annealing is used as part of the curing process, the laser annealing can be performed at an incident laser energy density that is equal to, or less than, 0.4 J/cm$^2$ and for a duration from about 1 nanosecond to about 500 nanoseconds. In some embodiments, a sacrificial assist layer is formed on the modified gap fill dielectric material layer prior to laser annealing.

In some embodiments, the bond breaking additive that is employed includes a light-weight element or molecule (i.e., an element or molecule having an atomic number that is equal to, or less than, argon) selected from hydrogen, helium, nitrogen, carbon, and neon. In one example, the bond breaking additive is nitrogen and the ion implanting is performed at an implantation energy from 1 keV to 40 keV and using an ion dosage from $1\times10^{13}$ ions/cm$^2$ to $3\times10^{14}$ atoms/cm$^2$. In another example, the bond breaking additive is helium and the ion implanting is performed at an implantation energy from 1 keV to 10 keV and using an ion dosage from $5\times10^{13}$ ions/cm$^2$ to $1\times10^{15}$ atoms/cm$^2$. In the present application, the bond breaking additive that is introduced into the as deposited gap fill dielectric material does not negatively impact the MTJ pillar or top electrode structure.

In another aspect of the present application, a memory structure is provided. In one embodiment, the memory structure includes a plurality of spaced apart and patterned material stacks located on a surface of a bottom electrode, wherein each patterned material stack comprises a multilayered magnetic tunnel junction (MTJ) pillar and a top electrode structure. A harden gap fill dielectric material having a dielectric permittivity of less than 3 and a first carbon content is located laterally adjacent to, and between, each patterned material stack. A via structure is located in the harden gap fill dielectric material, wherein the harden gap fill dielectric material adjacent to sidewalls of the via structure has a carbon of no less than 90% of the first carbon content.

DETAILED DESCRIPTION

Figure 1:
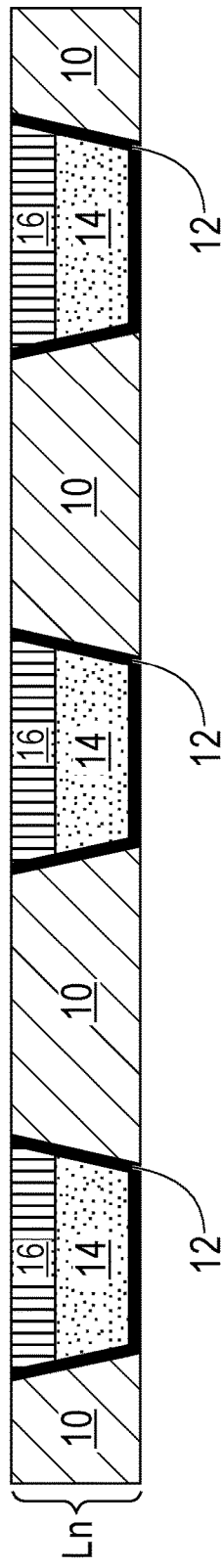
FIG. 1 is cross sectional view of an exemplary structure that can be employed in one embodiment of the present application, the exemplary structure includes an interconnect level including at least one electrically conductive structure embedded in an interconnect dielectric material layer, wherein a bottom electrode is located on a surface of the at least one electrically conductive structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the drawings of the present application illustrate a memory device area in which a memory device such as, for example, a MRAM device, will be formed. A non-memory device area may be located laterally adjacent to the memory device area illustrated in the drawings of the present application.

Referring now to FIG. 1, there is illustrated an exemplary structure that can be employed in one embodiment of the present application. The exemplary structure of FIG. 1 includes an interconnect level, $L_n$, including at least one electrically conductive structure 14 embedded in a an interconnect dielectric material layer 10, wherein a bottom electrode 16 is located on a surface of the at least one electrically conductive structure 14. In the present application, 'n' of interconnect level, $L_n$, can be an integer starting from 1.

Although not illustrated in the drawings, a metal level, $L_{n-1}$, can be located beneath interconnect level, $L_n$. In some embodiments, and when n is 1, metal level, $L_{n-1}$, is a middle-of-the-line (MOL) level. In other embodiments, and when n is 2, 3, 4, etc., metal level, $L_{n-1}$, is a lower interconnect level that is positioned beneath interconnect level, $L_n$. In either embodiment, metal level, $L_{n-1}$, includes a dielectric material layer that contains at least one metal level electrically conductive structure embedded therein that is connected, either directly or indirectly, to an underlying CMOS device (not shown) that is present in a front-end-of-the-line (FEOL) level (not shown). The FEOL level, the metal level, $L_{n-1}$, and the interconnect level, $L_n$, can be formed utilizing processes well known to those skilled in the art.

When n is 1, the dielectric material layer of metal level, $L_{n-1}$, can be composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants expressed herein are measured in a vacuum). Also, and in such an embodiment (i.e., when n is 1), the at least one metal level electrically conductive structure is a contact structure that includes a contact metal or a contact metal alloy such as, for example, tungsten (W), cobalt (Co), platinum (Pt), nickel (Ni) or alloys thereof.

When n is greater than 1, the dielectric material layer of metal level, $L_{n-1}$, can be composed of an interconnect dielectric material having a dielectric constant of less than 4.0. Exemplary interconnect dielectric materials that can be used include, but are not limited to, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Also, and in such an embodiment (i.e., when n is greater than 1), the at least one metal level electrically conductive structure is composed of an electrically conductive metal or an electrically conductive metal alloy. Examples of electrically conductive materials that can be used in the present application include copper (Cu), aluminum (Al), or tungsten (W), while an example of an electrically conductive metal alloy is a Cu—Al alloy.

The interconnect dielectric material layer 10 of interconnect level, $L_n$, can be composed of one of the interconnect dielectric materials mentioned above for the dielectric material layer of metal level, $L_{n-1}$. The interconnect dielectric material layer 10 can be formed by depositing an interconnect dielectric material and optionally curing it using known curing techniques compatible with back-end-of-the-line (BEOL) processing.

The depositing of the interconnect dielectric material that provides the interconnect dielectric material layer 10 can include chemical vapor deposition (CVD), plasma enhanced chemical vapor deposition (PECVD) or spin-on-coating. The interconnect dielectric material layer 10 can have a thickness from 30 nm 150 nm. Other thicknesses are possible and can be used as the thickness of the interconnect dielectric material layer 10.

The remaining components present in interconnect level, $L_n$, can be formed utilizing processes well known to those skilled in the art In one embodiment, at least one opening can be formed into the interconnect dielectric material layer 10 by lithography and etching. Lithography includes forming a photoresist material over a material or material stack that needs to be patterned, exposing the photoresist material to a pattern of irradiation, and then developing the exposed photoresist material.

An electrically conductive structure 14 can be formed into the at least one opening that is formed into the interconnect dielectric material layer 10. The electrically conductive structure 14 includes an electrically conductive metal or metal alloy as defined above. In some embodiments (not shown), the electrically conductive structure 14 has a topmost surface that is coplanar with the topmost surface of the interconnect dielectric material layer 10. In other embodiments and as shown in FIG. 1, the electrically conductive structure 14 has a topmost surface that is located beneath the topmost surface of the interconnect dielectric material layer 10.

In some embodiments and as shown in FIG. 1, a diffusion barrier liner 12 can be present along the sidewall and a bottom wall of the at least one opening. In some embodiments, no diffusion barrier liner is present. The diffusion barrier liner 12 is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

As is illustrated in the present application, bottom electrode 16 is present on a surface of each electrically conductive structure 14. In some embodiments (and as is illustrated), the bottom electrode 16 is located on a recessed surface of the electrically conductive structure 14. In other embodiments (not shown), the bottom electrode 16 is formed on a non-recessed surface of the electrically conductive structure 14. In such an embodiment, a dielectric capping layer (not shown) can be located laterally adjacent to the bottom electrode 16 and on a topmost surface of the interconnect dielectric material layer 10.

Bottom electrode 16 can be composed of Ta, TaN, Ti, TiN, Ru, RuN, RuTa, RuTaN, Co, CoWP, CoN, W, WN or any combination thereof. The bottom electrode 16 can have a thickness from 2 nm to 25 nm; other thicknesses are possible and can be used in the present application as the thickness of the bottom electrode 16. The bottom electrode 16 can be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) can follow the deposition of the conductive material that provides the bottom electrode 16.

In some embodiments (not shown) the bottom electrode 16 has a topmost surface that is coplanar with a topmost surface of a dielectric capping layer (not shown) that can be present laterally adjacent to the bottom electrode 16 and on a topmost surface of the interconnect dielectric material layer 10. In other embodiments (as is shown in FIG. 1), the bottom electrode 16 has a topmost surface that is coplanar with a topmost surface of the interconnect dielectric material layer 10.

Figure 2:
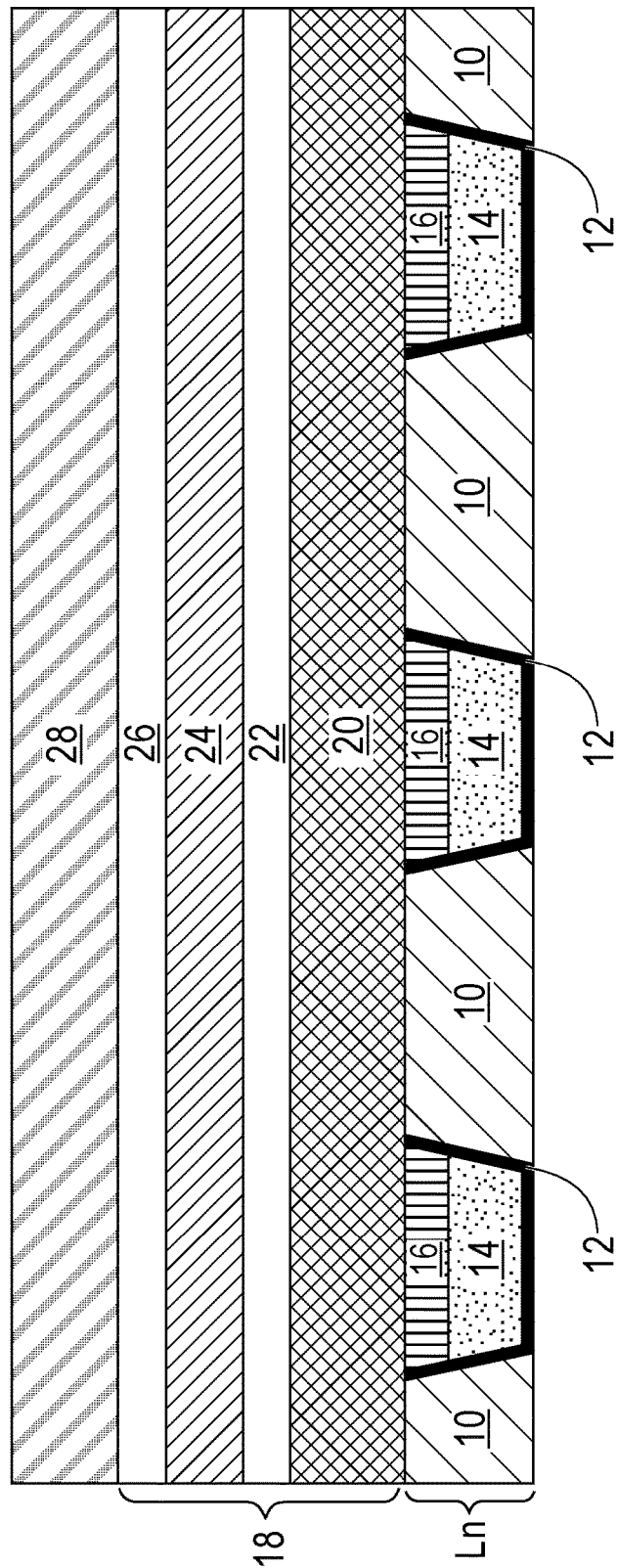
FIG. 2 is a cross sectional view of the exemplary structure of FIG. 1 after forming a multilayered magnetic tunnel junction (MTJ) stack and a top electrode metal-containing layer.

Referring now to FIG. 2, there is illustrated the exemplary structure of FIG. 1 after forming a multilayered magnetic tunnel junction (MTJ) stack 18 and a top electrode metal-containing layer 28. The MTJ material stack 18 includes at least a magnetic pinned layer, a tunnel barrier layer, and a magnetic free layer. In some embodiments and as shown in FIG. 2, the MTJ material stack 18 is a bottom pinned MTJ material stack that includes, from bottom to top, a magnetic pinned layer 20, a tunnel barrier layer 22, and a magnetic free layer 24. An optional metal seed layer (not shown) can also be present in the bottom pinned MTJ material stack. In the bottom pinned MTJ material stack, the optional metal seed layer is formed beneath the magnetic pinned layer 20. The bottom pinned MTJ material stack can also include a non-magnetic spacer layer (not shown) located on the magnetic free layer 24, a second magnetic free layer (not shown) located on the non-magnetic spacer layer, and/or a MTJ cap layer 26 located on the magnetic free layer 24 or on the second magnetic free layer.

In other embodiments (not shown), the MTJ material stack 18 is a top pinned MTJ material stack that includes, from bottom to top, a magnetic free layer, a tunnel barrier layer, and a magnetic pinned layer; in this embodiment, the order of elements 20 and 24 is reversed from those shown in FIG. 2. In such an embodiment, the top pinned MTJ material stack can also include an optional metal seed layer located beneath the magnetic free layer, a non-magnetic spacer layer located on the magnetic free layer, a second magnetic free layer located on the non-magnetic spacer layer, and/or a MTJ cap layer located on the magnetic pinned layer.

The various material layers of the MTJ material stack 18 can be formed by utilizing one or more deposition processes such as, for example, sputtering, plasma enhanced atomic layer deposition (PEALD), plasma enhanced chemical vapor deposition (PECVD) or physical vapor deposition (PVD).

The optional metal seed layer can be composed of platinum (Pt), palladium (Pd), nickel (Ni), rhodium (Rh), iridium (Jr), rhenium (Re) or alloys and multilayers thereof. In one example, the optional metal seed layer is composed of platinum (Pt).

The magnetic pinned layer 20 has a fixed magnetization. The magnetic pinned layer 20 can be composed of a metal or metal alloy (or a stack thereof) that includes one or more metals exhibiting high spin polarization. In alternative embodiments, exemplary metals for the formation of the magnetic pinned layer 20 include iron, nickel, cobalt, chromium, boron, or manganese. Exemplary metal alloys can include the metals exemplified by the above. In another embodiment, the magnetic pinned layer 20 can be a multi-layer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the magnetic pinned layer 20.

The tunnel barrier layer 22 is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators.

The magnetic free layer 24 can be composed of a magnetic material (or a stack of magnetic materials) with a magnetization that can be changed in orientation relative to the magnetization orientation of the magnetic pinned layer 20. Exemplary magnetic materials for the magnetic free layer 24 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer can include one of the magnetic materials mentioned above for magnetic free layer 24. In one embodiment, the second magnetic free layer is composed of a same magnetic material as the magnetic free layer 24. In another embodiment, the second magnetic free layer is composed of a magnetic material that is compositionally different from the magnetic free layer 24.

If present, the MTJ cap layer 26 can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer 26 can have a thickness from 2 nm to 25 nm; other thicknesses are possible and can be used in the present application as the thickness of the MTJ cap layer 26.

The top electrode metal-containing layer 28 can be composed of a conductive material such as, for example, Ta, TaN, Ti, TiN, Ru, RuN, RuTa, RuTaN, Co, CoWP, CoN, W, WN or any combination thereof. In one embodiment of the present application, top electrode metal-containing layer 28 is composed of Ti/TiN. The conductive material that provides the top electrode metal-containing layer 28 can be compositionally the same as, or compositionally different from, the conductive material that provides the bottom electrode 16.

In the present application, the top electrode metal-containing layer 28 can have a thickness that is from 100 nm to 500 nm; although other thicknesses are possible and can be used as the thickness of the top electrode metal-containing layer 28. The top electrode metal-containing layer 28 can be formed by a deposition process such as, for example, sputtering, plasma enhanced atomic layer deposition (PEALD), plasma enhanced chemical vapor deposition (PECVD) or physical vapor deposition (PVD).

Figure 3:
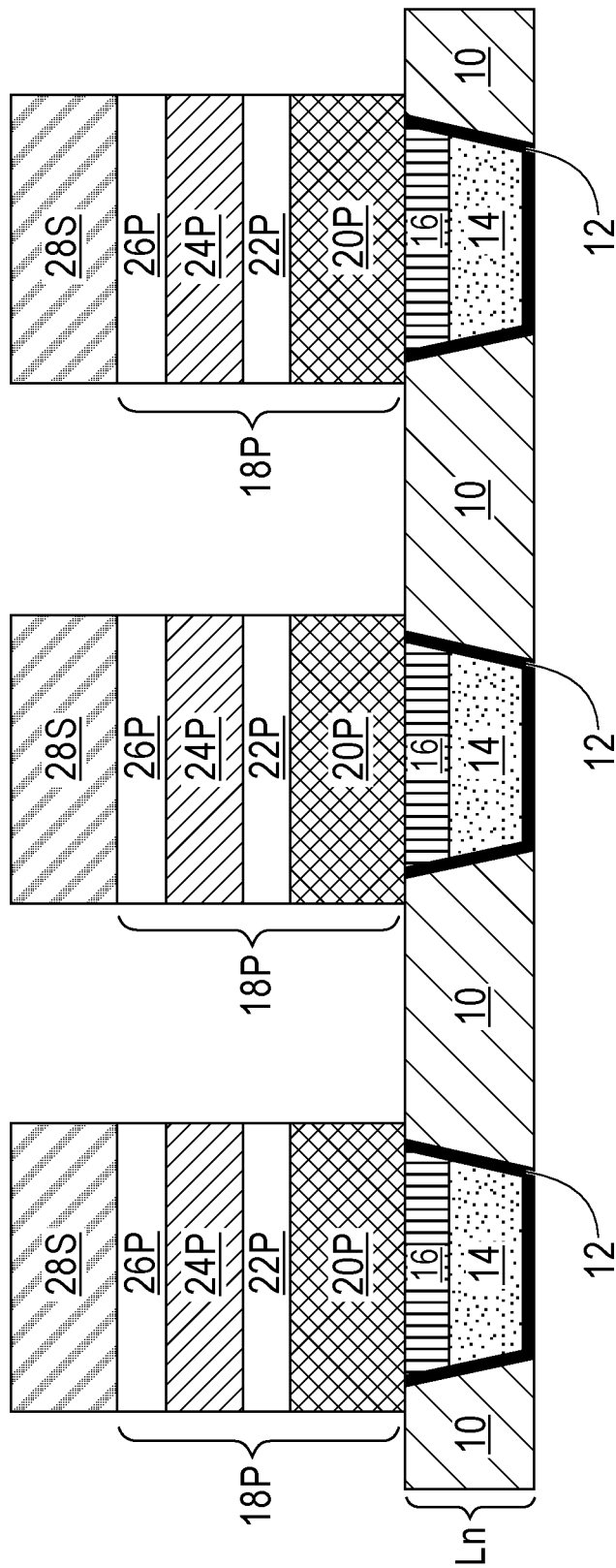
FIG. 3 is a cross sectional view of the exemplary structure of FIG. 2 after patterning the MTJ stack and the top electrode metal-containing layer to provide a MTJ pillar and a top electrode structure, respectively, located above the bottom electrode.

Referring now to FIG. 3, there is illustrated the exemplary structure of FIG. 2 after patterning the MTJ stack 18 and the top electrode metal-containing layer 28 to provide a MTJ pillar 18P and a top electrode structure 28S, respectively, located above the bottom electrode 16.

The patterning of the top electrode metal-containing layer 28 and the MTJ stack 18 can include first forming a patterned mask (not shown) on a physically exposed surface of the top electrode metal-containing layer 28. In some embodiments, the patterned mask can be composed of a photolithographic resist stack. In one embodiment, the photolithographic resist stack that provides the patterned mask can include a bottom organic layer, a middle inorganic layer and a top resist layer. The bottom organic layer of the photolithographic resist stack can include an organic planarization layer (OPL). The bottom organic layer of the photolithographic resist stack can include a spun-on organic layer such as, for example, a Near Frictionless Carbon (NFC), a diamond-like carbon, a thermosetting polyarylene ether or polyimide. The middle inorganic layer of the photolithographic resist stack can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer of the photolithographic resist stack can be composed of a resist material that provides for high resolution lithography patterning. The photolithographic resist stack can be formed be first providing a utilizing a series of deposition processes including first spin-on coating of the bottom organic layer, second spin-on coating of the middle inorganic layer, and third spin-on coating of the top resist layer. After providing the photolithographic resist stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic resist stack providing patterned mask. The transferring can include one or more etching processes.

In some embodiments, patterning can include first patterning the top electrode metal-containing layer 28 utilizing a first etching process such as, for example, a reactive ion etch, utilizing the patterned mask as an etch mask. The remaining, i.e., non-patterned, portion of the top electrode metal-containing layer 28 provides the top electrode structure 28S. The top electrode structure 28S can be cylindrical in shape; although other asymmetric shapes are possible and can be used in the present application as the shape of the top electrode structure 28S. The critical dimension (CD) of the top electrode structure 28S can vary and is not critical in the present application. The top electrode structure 28 typically has a width that is greater than the width on an upper portion of the bottom electrode 16. In such an instance, unwanted redeposition of metallic particles from the bottom electrode 16 onto the MTJ pillar 18P can be avoided.

After patterning the top electrode metal-containing layer 28, the patterned mask is removed from atop the top electrode structure 28S that is formed utilizing conventional processes well-known to those skilled in the art. The patterning of the MTJ material stack 18 is then performed utilizing an ion beam etch (IBE) in which the top electrode structure 28S is employed as a patterned mask. The remaining, i.e., non-patterned, portion of the MTJ stack 18 provides the MTJ pillar 18P. In one example and as shown in FIG. 3, each MTJ pillar 18P is a bottom pinned MTJ material structure that includes, from bottom to top, a magnetic pinned material layer portion 20P (i.e., a remaining, unetched portion of the magnetic pinned material layer 20), a tunnel barrier layer portion 22P (i.e., a remaining, unetched portion of the tunnel barrier layer 22), and a magnetic free layer portion 24P (i.e., a remaining, unetched portion of the magnetic free layer 24).

In another example (not shown), the MTJ pillar 18P is a top pinned MTJ structure that includes, from bottom to top, a magnetic free layer portion 24P, a tunnel barrier layer portion 22P, and a magnetic pinned material layer portion 20P. The MTJ pillar 18P can include remaining portions of any other layer that is present in the MTJ stack 18. For example, FIG. 3 illustrates a MTJ pillar 18P that includes a MTJ cap portion 26P (i.e., a remaining unetched portion of the MTJ cap layer 26). The MTJ pillar 18P can be cylindrical in shape; although other asymmetric shapes are possible and can be used in the present application as the shape of the MTJ pillar 18P; the MTJ pillar 18P and the top electrode structure 28S have a same shape. The critical dimension (CD) of the MTJ pillar 18P can vary and is not critical in the present application. The CD of the MTJ pillar 18P is typically the same as the CD of the top electrode structure 28S.

Collectively, the MTJ stack 18P and the top electrode structure 28S form a high-aspect structure with the total height exceeding 100 nm. Continuous memory cell scaling for increased memory density will cause the spacing between adjacent MTJ pillars to decrease leading to high-aspect-ratio gaps. The MTJ pillar 18P contains multiple functional layers described above. Proper operation of MTJ-based devices heavily relies on the precision engineering of various interfaces between these functional layers. The required spatial control of the interfaces shall be better than one atomic layer or about 0.3 nm. Furthermore, the structural material control (e.g., grain texture, material composition, etc.) of these functional layers in the MTJ pillar 18P is also paramount for achieving proper operation of MTJ-based devices. Accordingly, once the MTJ stack 18 is formed, great care needs to be taken to preserve the MTJ stack's material characteristics. Generally, any high-energy treatments of the thus formed MTJ stack 18 and MTJ pillar 18P are avoided.

Figure 4:
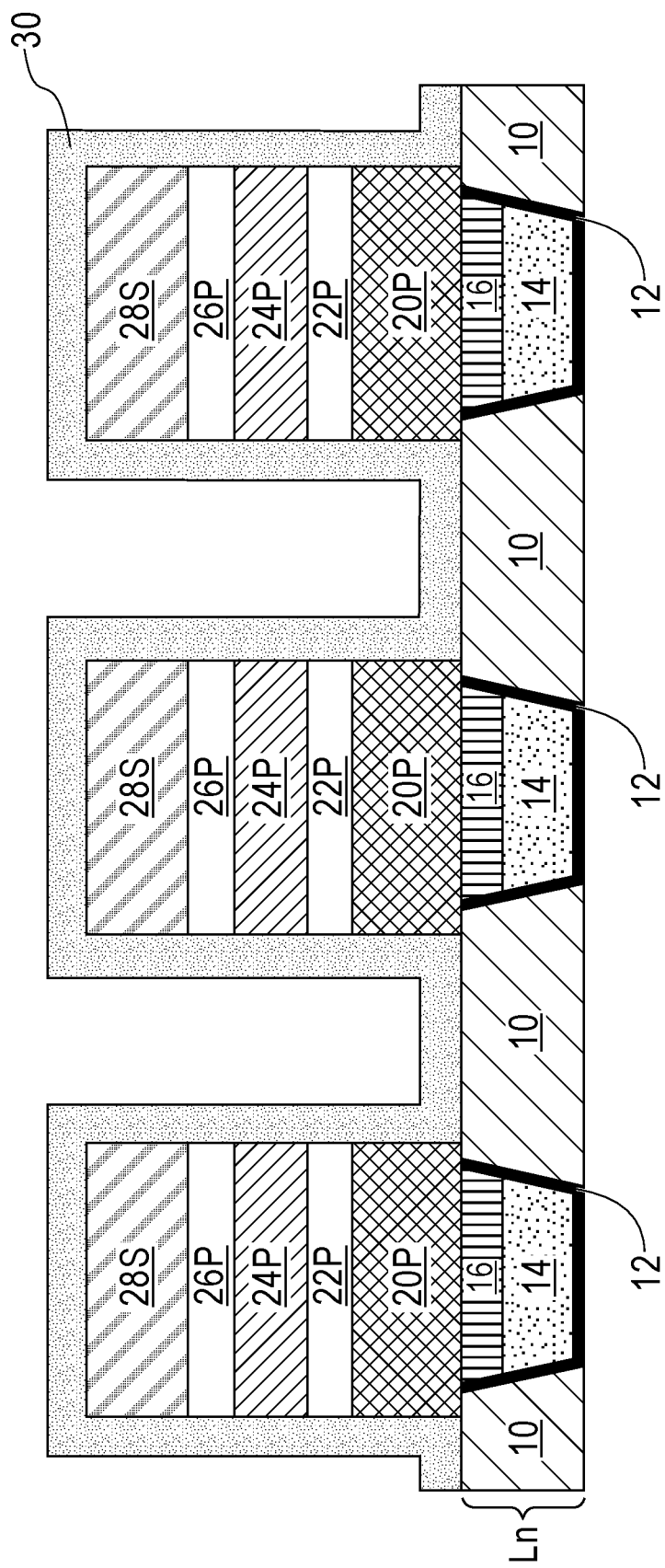
FIG. 4 is a cross sectional view of the exemplary structure of FIG. 3 after forming an encapsulation material layer.

Referring now to FIG. 4, there is illustrated the exemplary structure of FIG. 3 after forming an encapsulation material layer 30. The encapsulation material layer 30 is located on the sidewalls of each MTJ pillar 18P and on sidewalls and on top of each top electrode 28S. In some embodiments, the formation of the encapsulation material layer 30 can be omitted.

The encapsulation material layer 30 is composed of a dielectric material that is compositionally different from the interconnect dielectric material that provides the interconnect dielectric material layer 10. The dielectric material that provides the encapsulation material layer 30 may provide passivation to the top electrode structure 28S, and the MTJ pillar 18P. In one embodiment, the encapsulation material layer 30 is composed of silicon nitride. In another embodiment, the encapsulation material layer 30 can be composed of a dielectric material that contains atoms of silicon, carbon and hydrogen. In some embodiments, and in addition to atoms of carbon and hydrogen, the dielectric material that provides the encapsulation material layer 30 can include atoms of at least one of nitrogen and oxygen. In other embodiments, and in addition to atoms of silicon, nitrogen, carbon and hydrogen, the dielectric material that provides the encapsulation material layer 30 can include atoms of boron. In one example, the encapsulation material layer 30 can be composed of an nBLOK dielectric material that contains atoms of silicon, carbon, hydrogen, nitrogen and oxygen. In alternative example, the encapsulation material layer 30 can be composed of a SiBCN dielectric material that contains atoms of silicon, boron, carbon, hydrogen, and nitrogen.

The encapsulation material layer 30 is a continuous, conformal layer that can be formed by a deposition process such as, for example, chemical vapor deposition (CVD), plasma enhanced chemical vapor deposition (PECVD), physical vapor deposition (PVD) or atomic layer deposition (ALD). The term "conformal" denotes that a material layer has a vertical thickness along horizontal surfaces that is substantially the same (i.e., within ±5%) as the lateral thickness along vertical surfaces. The encapsulation material layer 30 can have a thickness from 10 nm to 200 nm. Other thicknesses are possible and can be employed as the thickness of the encapsulation material layer 30. The presence of the encapsulation material layer 30 shrinks the gap between adjacent MTJ pillars 18P making the gap aspect ratio higher.

In some embodiments, the encapsulation material layer 30 is formed by a low temperature deposition process. The term "low temperature deposition process" denotes a deposition process that is performed at a temperature of 400° C. or less. In one embodiment, the deposition of the encapsulation material layer 30 is performed at a temperature from 200° C. to 400° C. In an alternative embodiment, the deposition of the encapsulation material layer 30 is performed at a temperature from 200° C. to 350° C. A low temperature deposition prevents surface diffusion of metal particles across the tunnel barrier layer of the multilayered MTJ pillar 18P which may lead to device shorting. The metal particles are formed during the etching of the blanket layers that provide the multilayered MTJ pillar 18P.

In some embodiments, the encapsulation material layer 30 can be of low quality. Stated in other terms, the encapsulation material layer 30 can have poor mechanical and chemical properties associated therewith that need to be improved prior to further processing of the MTJ device. By "low quality" it is meant that the encapsulation material layer 30 is defective (contains a high content of carbon and hydrogen impurities), has poor hermeticity, a low Young's modulus, and a relatively high amount of bond terminating radicals such hydrogen, hydro-carbon groups, and amino groups that disrupt a framework of chemically strong —Si—O—, —Si—N—, —C—N— and —B—N— bonding chains. Consequently, the encapsulation material layer 30 can has a low etch resistance and a high etch or erosion rate.

Figure 5:
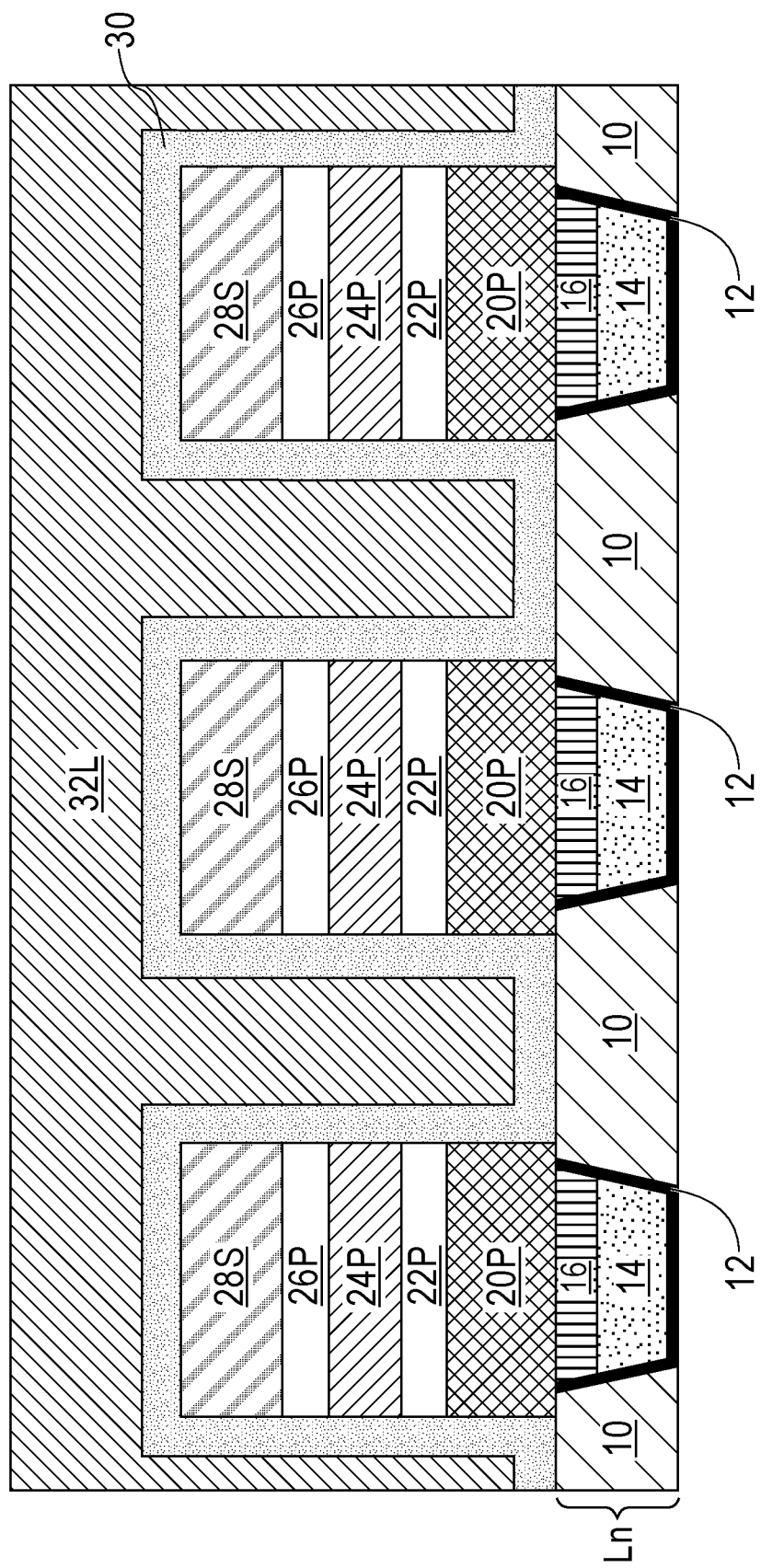
FIG. 5 is a cross sectional view of the exemplary structure of FIG. 4 after forming a gap fill dielectric material layer having self-planarizing properties.

Referring now to FIG. 5, there is illustrated the exemplary structure of FIG. 4 after forming a gap fill dielectric material layer 32L having self-planarizing properties. The gap fill dielectric material layer is formed laterally adjacent to, and on top of each patterned structure (i.e., the MTJ pillars 18P and the top electrode structures 28S). The gap dilled dielectric material layer 32L is voidless. As is shown, the gap fill dielectric material layer 32L is formed on the encapsulation material layer 30. The gap fill dielectric material layer 32L is composed of a dielectric material that is compositionally different from the dielectric material of the encapsulation material layer 30. In one embodiment, the gap fill dielectric material layer 32L is composed of a flowable CVD or a spin-on dielectric material such as, for example, a dielectric material containing atoms of Si, C, O and H. In some embodiments, the flowable low-k dielectric is nanoporous. The nanopores can be created in the gap fill dielectric material 32L in later steps by activating organic porogen additives that can be present in an as deposited gap filler dielectric material. In some embodiments, the flowable deposition process mixes the organic precursors for achieving target flowability and sacrificial porogen (e.g., cyclohexene) and the matrix precursor for a siloxane-based backbone structure (e.g., decamethylcyclopentasiloxane, diethoxymethylsilane, dimethyldimethoxysilane, tetramethylcyclotetrasilane, octamethylcyclotetrasilane). A flowable CVD or a spin-on dielectric material can flow into and fill very small gaps between structures having a topography without forming voids or seams. In some embodiments, flowability is achieved by employing siloxane-based polymers where two silicon bonds are terminated by radicals such as hydrogen and/or methyl and two other bonds participate in the siloxane backbone chain. The flowability can be influenced by the length of the siloxane-based polymer chains and by the amount and type of organic additives or solvents. Longer polymeric chains and higher content of organic solvent lead to an increased flowability. As-deposited flowable dielectric materials are chemically weak and may have a relatively high dielectric constant (e.g., around 4.0) and is typically void of nanopores. After deposition, a flowable dielectric material requires a curing process that will convert this material into its low-k state (i.e., a dielectric constant of less than 4.0), form nanopores, and improves its chemical strength. The gap fill dielectric material layer 32L is formed by CVD or spin-on coating processes; while no planarization process is used in forming the gap fill dielectric material layer 32L shown in FIG. 5, an optional CMP process can be used to planarize the gap fill dielectric material 32L prior to curing.

An exemplary curing process of flowable dielectric materials may include heating to up to 400° C. in the presence of intense UV light containing radiation wavelength below about 250 nm. The curing process results in scission of weakly-bonded organic groups (e.g., $CH_3$, $CH_2$, H) and crosslinking freed-up dangling bonds into a strong chemical backbone network (e.g., a crosslinked siloxane-based —Si—O— backbone) while forming a target amount of nanopores. In some embodiments, the crosslinking involves breaking one of the organic radical groups from some Si atoms in the polymer chain and forming three Si—O bonds for those atoms while keeping the fourth silicon bond terminated by a radical group such as hydrogen (H) and/or methyl ($CH_3$). It should be appreciated that a certain amount of these organic radical groups are required to achieve a low dielectric permittivity k while a certain amount of crosslinking is required to achieve a certain level of chemical and mechanical strength. Bond scission is primarily driven by photochemical reactions initiated by abundant energetic UV photons while the removal of detached organic groups is primarily driven by a diffusion process conducted at an elevated substrate temperature. A conventionally cured gap fill dielectric material layer can be of low quality due to inefficiencies in the curing process.

The gap fill dielectric material layer 32L of the present application can have poor mechanical and chemical properties associated therewith that need to be improved prior to further processing of the MTJ device. By "low quality" it is meant that the gap fill dielectric material layer 32L is defective (contains a high content of carbon and hydrogen impurities), has poor hermeticity, a low Young's modulus, and a relatively high amount of bond terminating radicals such hydrogen, hydro-carbon groups, and amino groups that disrupt a framework of chemically strong —Si—O—, —Si—$CH_2$—, and —C—O— bonding chains crosslinked by chemically strong bonds of the same type. In some embodiments, the low quality refers to the gap fill dielectric material layer's 32L resistance to an oxygen-containing plasma often employed in RIE processes. Oxygen radicals and ions produced in such plasma attack organic radical groups present in abundance in the gap fill dielectric material layer 32L replacing them with a hydroxyl group (—OH). This manifests itself with a reduction of Si—$CH_3$ and Si—H bond amounts and an increase of Si—OH bond amount. Consequently, the gap fill dielectric material layer 32L exposed to oxygen-containing plasma can have a low etch resistance and a high etch or erosion rate.

Figure 6:
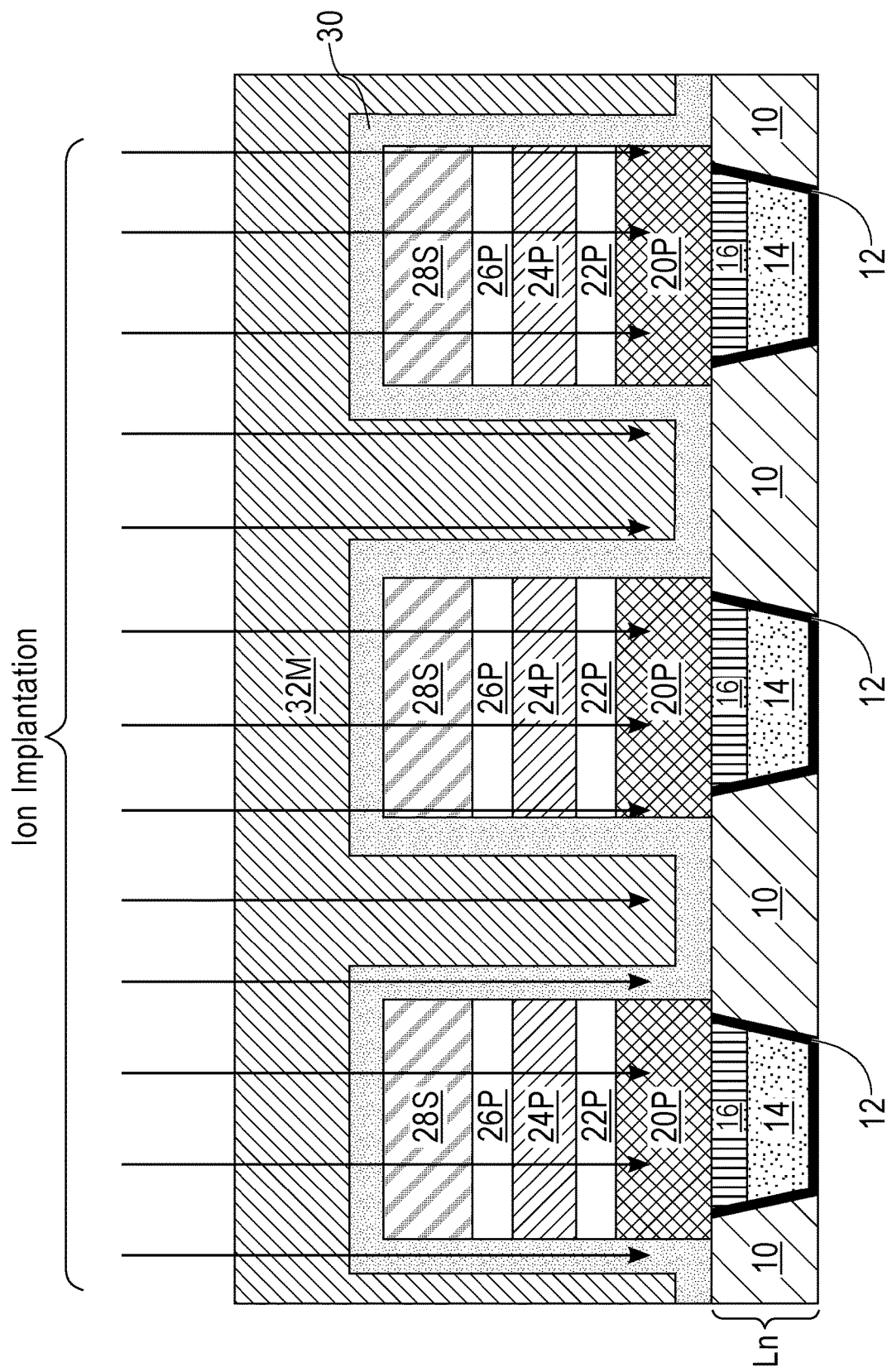
FIG. 6 is a cross sectional view of the exemplary structure of FIG. 6 after introducing, via ion implantation a bond breaking additive into the as deposited gap fill dielectric material layer to provide a modified gap fill dielectric material layer.

Referring now to FIG. 6, there is illustrated the exemplary structure of FIG. 5 after introducing, via ion implantation, a bond breaking additive into the gap fill dielectric material layer 32L to provide a modified gap fill dielectric material layer 32M. The introduction of the bond braking additive is performed prior to curing. In FIG. 6, the arrows illustrate the direction of the ion implantation process.

In the present application, the modification of the gap fill dielectric material 32L, which occurs prior to curing, includes ion implanting a bond breaking additive into the gap fill dielectric material layer. The bond breaking additive includes a light-weight element or molecule. By "light-weight element" it is meant an element having an atomic number Z that is equal to or less than that of argon (Z=18). Illustrative examples of light-weight elements that can be used as the bond breaking additive include, but are not limited to, hydrogen (H), helium (He), nitrogen (N), carbon (C), or neon (Ne). The light-weight molecules are light-weight elements such as molecular hydrogen ($H_2$) and molecular nitrogen ($N_2$). Implantation is conducted into the as-deposited gap fill dielectric material layer 32L throughout its thickness to provide the modified gap fill dielectric material layer 32M. The implantation energy determines the depth of penetration into gap fill dielectric material layer 32L. Varying penetration levels can be achieved by predetermining the ion implantation energy. Multiple implantation energies can be employed to distribute the implanted ions uniformly throughout the gap fill dielectric material layer 32L or to distribute the implantation damage uniformly throughout the gap fill dielectric material layer 32L. The ion implantation dose is selected such that implanted elements do not exceed 0.5 atomic percent of gap fill dielectric material constituents.

In one embodiment, the modifying bond-breaking light-weight element is a nitrogen atom. In this embodiment, nitrogen can be ion implanted using an ion implantation energy from 1 keV to 40 keV and an implantation dose from $1 \times 10^{13}$ ions/$cm^2$ to $3 \times 10^{14}$ ions/$cm^2$. Using the aforementioned ion implantation conditions, the concentration of nitrogen that is added to the gap fill dielectric material layer 32L is from 0.01 atomic percent to 0.1 atomic percent (stated in other terms the concentration of nitrogen that is added to the gap fill dielectric material layer 32L is from $5 \times 10^{18}$ atoms/$cm^3$ to $5 \times 10^{19}$ atoms/$cm^3$). Also, and with respect to using the aforementioned ion implantation conditions, the nitrogen penetrates into the gap fill dielectric material layer 32L to a depth from 200 Å to 2000 Å. The ion implantation for using C and Ne are similar to those mentioned above for nitrogen. The nitrogen can be also implanted in its molecular form ($N_2^+$). In this case, the implantation energy range will be increased by a factor of two and the ion implantation dose range will be decreased by a factor of two.

In another embodiment of the present application, the modifying bond-breaking light-weight element is a helium atom. In this embodiment, helium can be ion implanted using an ion implantation energy from 1 keV to 10 keV and an implantation dose from $5 \times 10^{13}$ ions/cm$^2$ to $1 \times 10^{15}$ ions/cm$^2$. Using the aforementioned ion implantation conditions, the concentration of helium that is added to the gap fill dielectric material layer 32L is from 0.05 atomic percent to 0.5 atomic percent (stated in other terms the concentration of helium that is added to the gap fill dielectric material 32L is from $2.5 \times 10^{19}$ atoms/cm$^3$ to $2.5 \times 10^{20}$ atoms/cm$^3$). Also, and with respect to using the aforementioned ion implantation conditions, the helium penetrates into the gap fill dielectric material layer 32L to a depth from 200 Å to 2000 Å. The ion implantation conditions for using H$^+$ or H$_2^+$ are similar to those mentioned above for helium.

The implantation step can be conducted using a conventional beamline ion implanter or a plasma immersion implantation equipment. In the case of plasma immersion implantation, the implantation energy is controlled by substrate electrical bias with respect to the plasma potential. In order to achieve a uniform distribution of implanted ions and/or a uniform distribution of implantation-induced bond scission (damage), the implantation step can be conducted using multiple implantation energies as alluded above.

The implantation step does not negatively impact the MTJ pillar 18P or the top electrode structure 28S due to the low dose of the implantation that does not significantly modify inorganic metallic films of the electrode structure 28S and MTJ pillar 18P. However, the low implantation dose causes significant changes in organic components of the gap fill dielectric material layer 32L. Further, the addition of the bond breaking additive into the encapsulation material liner 30L does not negatively affect mostly-inorganic encapsulation material layers.

Figure 7:
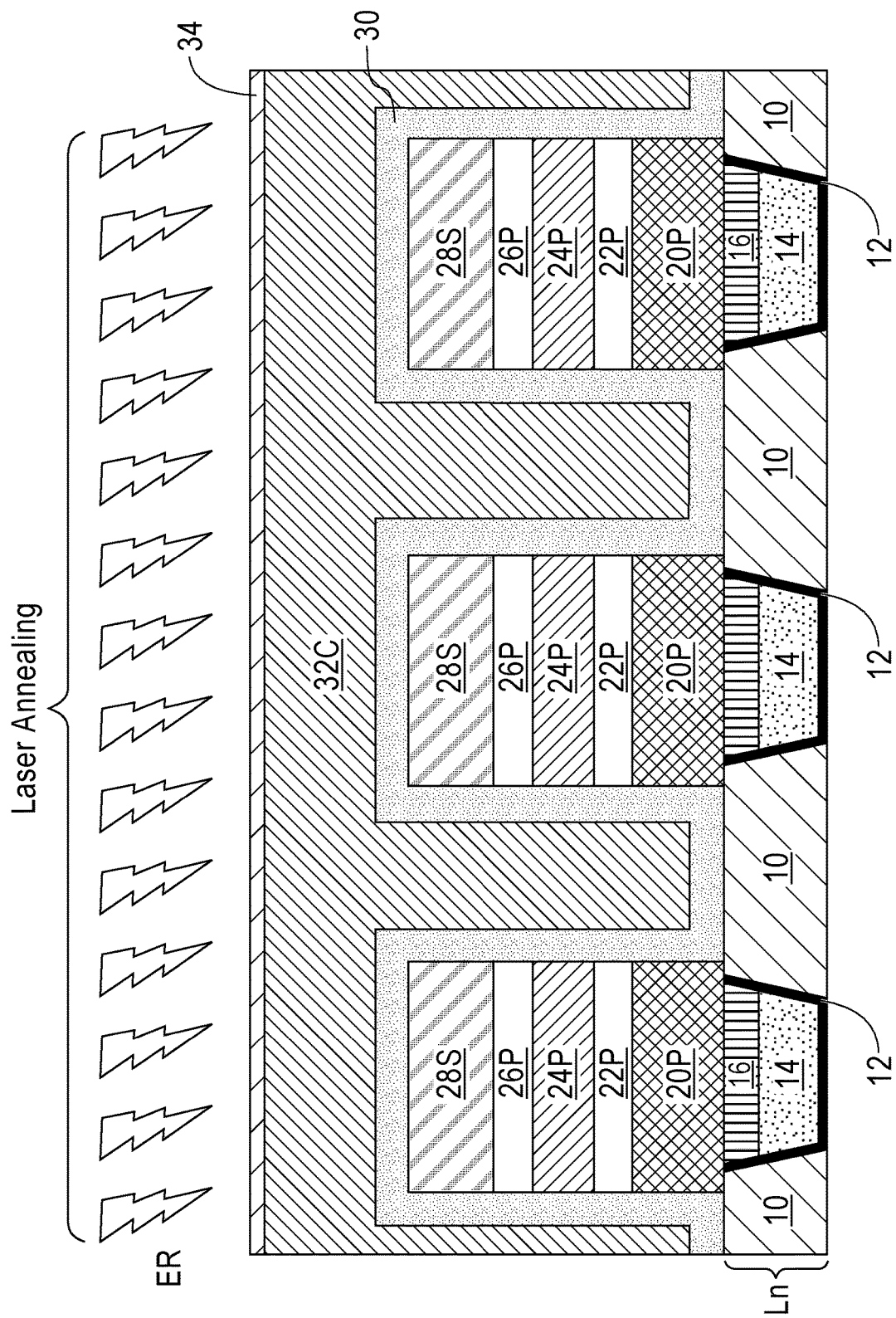
FIG. 7 is a cross sectional view of the exemplary structure of FIG. 6 after performing a laser anneal as a first step of a curing process in accordance with an embodiment of the present application.
Figure 8:
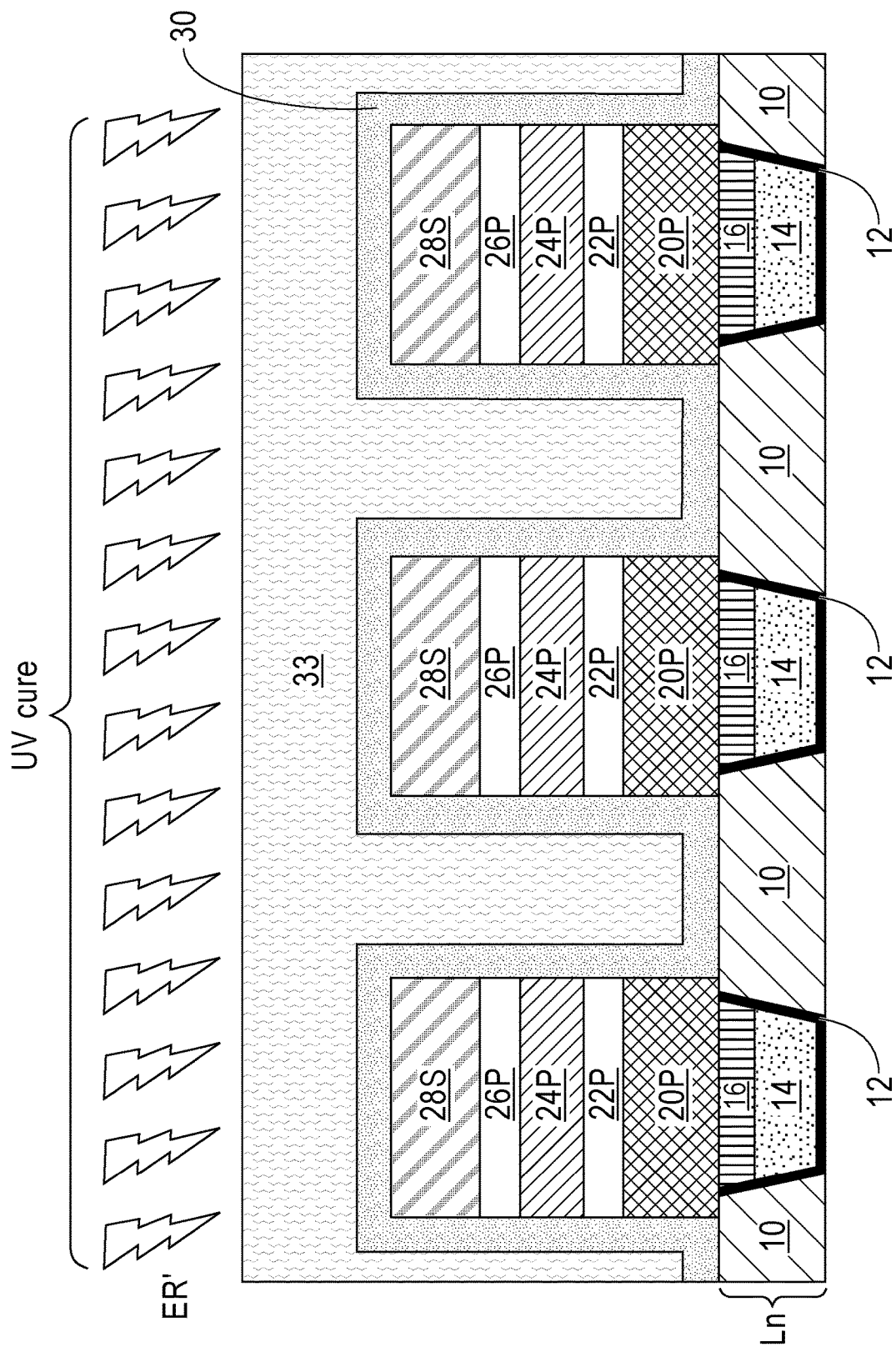
FIG. 8 is a cross sectional view of the exemplary structure of FIG. 7 after performing a UV cure after the laser anneal to provide a harden gap fill dielectric material layer.

The modified gap fill dielectric material layer 32M is thereafter cured (as will be discussed in greater detail herein below) with the aid of an energy source in the form of electromagnetic radiation. The curing may include UV curing alone, or UV curing in combination with a laser anneal. The laser anneal may be performed prior to, or after, UV curing. In a preferred embodiment and as shown in FIGS. 7 and 8, laser annealing is performed prior to UV curing. During the curing process of the present application, the modified gap fill dielectric material layer 32M is maintained at an elevated temperature. Due to the temperature sensitive structures that are present in the substrate at this step (e.g., the MTJ pillar 18P), the substrate temperature is limited to 400° C. for exposures longer than several seconds, 800° C. for exposures shorter than tens of milliseconds but longer than several microseconds, and 1200° C. for exposures shorter than several microseconds.

Referring now to FIG. 7, there is illustrated the exemplary structure of FIG. 6 after performing a laser anneal as a first step of a curing process in accordance with an embodiment of the present application. In this case, the curing energy source is the electromagnetic radiation, ER, of the incident laser beam. In some embodiments, the laser anneal is omitted and curing is performed utilizing a UV cure as defined herein below. In yet other embodiments, curing may include a UV cure, followed by a laser anneal. In FIG. 7, element 32C denotes a laser annealed modified gap fill dielectric material layer.

In some embodiments, a sacrificial assist layer 34 can be deposited onto the modified gap fill dielectric material layer 32M prior to laser annealing. The purpose of the sacrificial assist layer 34 is to couple the electromagnetic radiation, ER, into the substrate and to assist heating the modified gap fill dielectric material layer 32M to the target temperature. The sacrificial assist layer 34 is a continuous layer that is formed across the entire structure shown in FIG. 7. In one embodiment, the sacrificial assist layer 34 is an absorber layer. The material of the absorber layer is selected to be absorbing to the electromagnetic radiation, ER, of the incident laser beam. In one embodiment, the absorber layer is a TaN having an extinction coefficient of 1.27 at 308 nm.

The sacrificial assist layer 34 can be formed utilizing a conventional deposition process such as, for example, chemical vapor deposition (CVD), plasma enhanced chemical vapor deposition (PECVD), atomic layer deposition (ALD) or sputtering. The sacrificial assist layer 34 can have a thickness from 1 nm to 20 nm. Other thicknesses are possible for the sacrificial assist layer 34 so long as the thickness is enough to absorb most of the electromagnetic radiation, ER. The laser annealing employed at this step does not negatively impact the MTJ pillars 18P.

The laser annealing used as a first step of the curing process of the present application is a short duration (within a nanosecond range) laser anneal, as defined herein. Such a laser anneal can be used to improve the properties (chemical and mechanical) of a dielectric material such as the modified gap fill dielectric material layer 32M. The laser anneal may harden the modified gap fill dielectric material layer 32M resulting in the laser annealed modified gap fill dielectric material layer 32C.

As used herein, the term "laser annealing" denotes an annealing method that employs a laser to induce heat in the surface being treated. A laser is an electro-optical device that emits coherent radiation. In some embodiments, a typical laser emits light in a narrow, low-divergence beam and with a defined wavelength. In some instances, the advantages of employing laser for annealing processes is that its light can be easily shaped and focused onto a specific area of the annealing surface to achieve very high radiation intensity with short exposure durations.

In some embodiments, the short exposure duration is achieved by raster scanning focused laser beam over a surface of a substrate that includes an as deposited dielectric materials, i.e., interconnect dielectric material, encapsulation material or modified gap fill dielectric material. In this case, the exposure duration measured at incident intensity FWHM is the beam width in the scanning direction divided by the scanning velocity. In alternative embodiments, the short exposure duration is achieved by employing a pulsed laser. In this case, the laser beam is shaped to achieve a required peak intensity over a selected substrate area such as over an entire product die and the laser is operated in a pulsed mode such as in the case of Q-switched laser. The pulse duration of Q-switched laser at intensity FWHM (i.e., full width at half maximum) determines the substrate exposure time. The exposure process is repeated for entire wafer surface in a step-and-repeat approach. In some embodiments, the exposure to light, i.e., by laser annealing, e.g., application of the laser beam, includes 1 pulse to 100 pulses of light exposure.

In some embodiments, the laser type that is employed in the laser annealing method of the present application is selected from a solid-state Nd:YAG laser emitting at 1064 nm and frequency-doubled or -tripled emitting at 532 nm or 355 nm, respectively, or an excimer laser emitting at below 400 nm. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds such as ArF (193 nm), KrCl (222 nm), KrF (248 nm), XeCl (308 nm), and XeF (351 nm). Excimer lasers are usually operated in a Q-switched, pulsed mode suitable for step-and-repeat pulsed wafer exposure. Solid-state Nd:YAG lasers provide an alternative to excimer lasers due to its stable, high-power output at 1,064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation. The laser wavelength selection is important for coupling laser radiation into suitable absorbing materials. Common dielectric materials are either not absorbing or only weakly absorbing (e.g., absorbing less than 5% of the coupled radiation) even at a short wavelength of from about 350 nm to about 250 nm; the term "about" is used herein to denote ±10 percent or less from a stated value. Metals and metallic compounds, on the other hand, absorb radiation at a wavelength of about 600 nm or shorter making shorter wavelength laser more preferred for structures with metallic layers. In some embodiments, an XeCl laser (308 nm) can be employed coupling about 35% of its incident radiation into the top electrode 28S and the MTJ pillar 18P thereby heating the adjacent modified gap fill dielectric material layer 32M from below. In alternative embodiments, an XeCl laser (308 nm) can be employed coupling about 60% of its incident radiation into the sacrificial assist layer 34 thereby heating the underlying modified gap fill dielectric material layer 32M from above.

Once the substrate including the modified gap fill dielectric material layer 32M is exposed to the laser radiation either through raster scanning or through a laser pulse, the temperature of metal-containing structures present in the substrate begin raising from a base value and falls shortly after. Raising temperature of the metal-containing structures in the metal level causes thermal energy or heat to flow into adjacent structures including the modified gap fill dielectric material layer 32M raising their temperature in lock step with that of the metal-containing structures present in the substrate. A representative temperature-time trace of a nanosecond laser anneal process includes four (4) distinct temperature regions: initial or base substrate temperature, heat-up portion, temperature peak point, and cool down portion. Initial or base substrate temperature is within the range of from 23° C. (room temperature) to 400° C. This temperature is typically set by a hot plate on which the substrate resides. Alternative heating devices may also be used to keep the substrate at a base temperature. Such alternative or additional heating devices can include backside or frontside lamp annealing, microwave heating, and secondary millisecond-scale pre-heat lasers beams. The laser beam having wavelength at near 308 nm raises the surface temperature of substrate including the modified gap fill dielectric material layer 32M from the base temperature to the peak with the ramp up rate from about 1,000,000,000° C./sec to about 100,000,000,000° C./sec. After laser radiation exposure, the surface temperature including that of the modified gap fill dielectric material layer 32M quickly drops back to the base temperature with the temperature ramp down rate of from about 300,000,000° C./sec to about 30,000,000,000° C./sec. The anneal duration measured at around the temperature peak point, typically at a level 50° C. below the peak point, ranges from about 1 nanosecond to about 500 nanoseconds but from about 10 to about 100 nanoseconds is more typical.

It is customary to specify the process duration of laser anneals in terms of the radiation exposure duration at FWHM rather than the anneal duration at the temperature level 50° C. below the peak temperature. These duration quantities are related to each other and, in some embodiments, the anneal duration is a fraction (e.g., about ⅓) of the radiation exposure duration.

Laser-induced surface temperature rise is set by the laser incident radiation intensity, laser pulse or exposure duration, and optical and thermal properties of the as deposited interconnect dielectric material and the underlying substrate. Short frontside laser exposure causes a non-uniform heating of the substrate including the modified gap fill dielectric material layer 32M. The heat penetration depth in the case of nanosecond-scale laser pulses ranges from about 1 micron to about 5 microns in metallic structures such as copper and from about 100 nanometers to about 500 nanometers in typical interconnect dielectrics. Accordingly, a relatively thick substrate including the modified gap fill dielectric material layer 32M may be heated relatively uniformly throughout its entire thickness with a small top-to-bottom temperature gradient of approximately 0.1-3° C./nm. This also ensures that the modified gap fill dielectric material layer 32M is heated to a similar temperature throughout its thickness of less than about 100 nm.

It will be appreciated that the required radiation intensity at which substrate including the as deposited dielectric material reaches a target anneal temperature range of from about 1000° C. to about 1300° C. depends on specific materials present in the substrate, laser pulse duration, and selected laser wavelength. However, the required incident radiation intensity can be determined experimentally for specific set of the substrate including the modified gap fill dielectric material layer 32M and annealing parameters by incorporating copper material into metal level and observing its melting point at about 1090° C. In some embodiments, the nanosecond laser wavelength is 308 nm, the substrate base temperature is 250° C., the pulse duration at FWHM is 160 nanoseconds, and the coupled laser energy density at which the copper layer in the metal level starts to melt is 0.13 J/cm$^2$ (this corresponds to 0.2 J/cm$^2$ of incident laser energy density). This calibration point can be converted into the required incident laser energy density for a particular choice of metal present in the metal level by properly normalizing to the metal optical reflectance at 308 nm.

In some embodiments, the laser anneal of the substrate including the modified gap fill dielectric material layer 32M is performed at an incident laser energy density that is equal to, or less than 0.4 J/cm$^2$. In one example, the laser annealing of the substrate including the as deposited dielectric material is performed at an incident laser energy density from 0.03 J/cm$^2$ to 0.38 J/cm$^2$. In an alternative embodiment, the laser annealing can be performed incident laser energy density from 0.03 J/cm$^2$ to 0.46 J/cm$^2$. In some embodiments, the targeted annealing temperature range of from about 1000° C. to about 1300° C. will require the incident laser energy density to be less than 0.4 J/cm$^2$.

The substrate can contain metal-containing structures (including an absorber layer 34) with a relatively low melting point of below about 1300° C. In this case, the desired anneal temperature range is from about 1000° C. to below the melting point of metal-containing structures present in the substrate. The melting point of metal-containing structures and a corresponding threshold in the incident laser energy density can be determined experimentally for a particular choice of the materials that provide the substrate including the as deposited dielectric material and laser annealing parameters by observing the metal-containing structures electrical functionality before and after laser annealing.

Referring now to FIG. 8, there is illustrated the exemplary structure of FIG. 7 after performing UV lamp curing (i.e., UV curing) as a second step of the curing process of the present application. In step, the curing energy source is the electromagnetic radiation, ER', of the UV lamp. In some embodiments, the electromagnetic radiation wavelength is in the UV region of spectrum and is preferably shorter than 250 nm, the substrate temperature is from 200° C. to 400° C. and the process duration is from 1 minute to 10 minutes. In some embodiments, the UV curing can be performed on the exemplary structure shown in FIG. 6 without invoking a laser anneal as part of the curing process.

Electromagnetic radiation, ER', passing through the modified gap fill dielectric material layer 32M held at an elevated temperature or through the laser annealed modified gap fill dielectric material layer 32C held at an elevated temperature chemically transforms those gap fill dielectric materials into a harden gap fill dielectric material layer 33. The harden gap fill dielectric material layer 33 is voidless, has a dielectric permittivity of less than 3 and a first carbon content.

Upon this transformation, the harden gap fill dielectric material layer 33 possesses unique material properties such that its' dielectric constant is below 3 and typically within 2.7-2.9 range and its' wet etch rate of plasma-ion-damaged material is 2-4 times improved (lower) than that of a flowable low-k film cured by a conventional UV curing process alone. The harden gap fill dielectric material layer 33 has a slightly increased (less than 5%) dielectric constant as compared to the dielectric constant of the conventionally-cured gap fill dielectric material. Importantly, the low-dose implantation, the nanosecond laser annealing, and the conventional UV curing process employed at this step do not negatively impact the MTJ pillars 18P and top electrode structures 28S.

While FIG. 7 and FIG. 8 show a preferred order of curing (first laser annealing and then UV lamp curing), other curing sequences are also feasible yielding similar benefits. In one embodiment, the laser annealing can be skipped. In another embodiment, the conventional UV curing can be conducted prior to laser annealing. In yet another embodiment, the curing sequence shown in FIG. 7 and FIG. 8 can be followed by an additional laser annealing step. In any of the embodiments mentioned above, and after performing laser annealing, the sacrificial assist layer 34 can be selectively removed utilizing any conventional material removal process including, but not limited to, planarization or etching.

Figure 9:
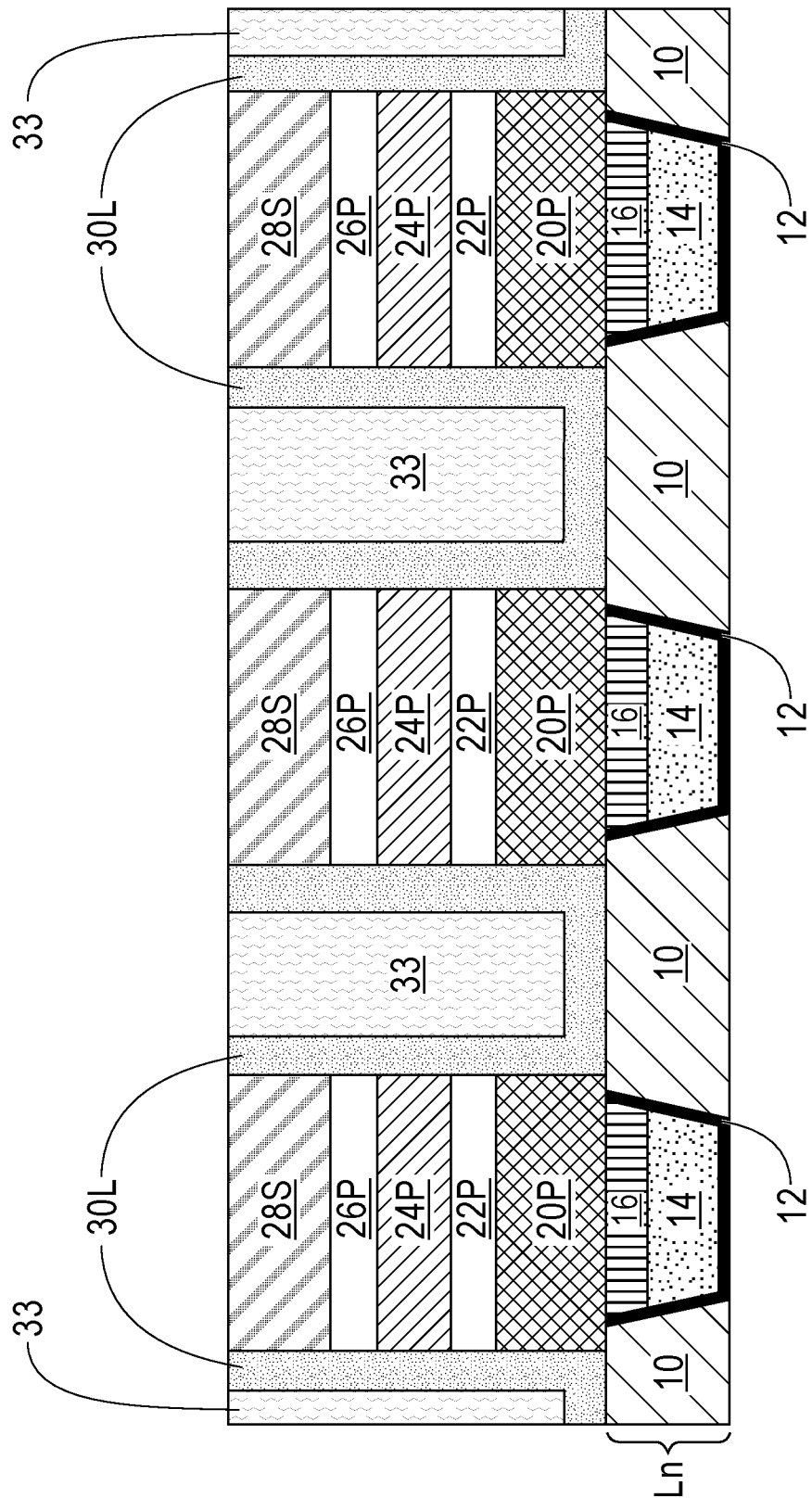
FIG. 9 is a cross sectional view of the exemplary structure of FIG. 8 after removing the harden gap dielectric fill material layer and the encapsulation material layer from the top of the patterned material stack.

Referring now to FIG. 9, there is illustrated the exemplary structure of FIG. 8 after performing a planarizing process to remove the harden gap fill dielectric material layer 33 and the encapsulation material layer 30 that is located above a topmost surface of the top electrode structure 28S. A harden gap fill dielectric material 33 remains laterally adjacent to each MTJ pillar 18P and each top electrode structure 28S. Also, a remaining portion, i.e., encapsulation material liner 30L, of the encapsulation material layer 30 remains on the sidewalls of each MTJ pillar 18P and each top electrode structure 28S. In some embodiments, the encapsulation liner 30L may remain over top electrode structure 28S (not shown). The planarizing process can include chemical mechanical polishing and/or grinding.

The harden gap fill dielectric material 33 has a topmost surface that is coplanar with a topmost surface of the encapsulation material liner 30L and/or the topmost surface of the top electrode structure 28S. The harden gap fill dielectric material 33 has improved chemical and physical properties. In some embodiments, the encapsulation material liner 30L also has improved chemical and physical properties.

Figure 10:
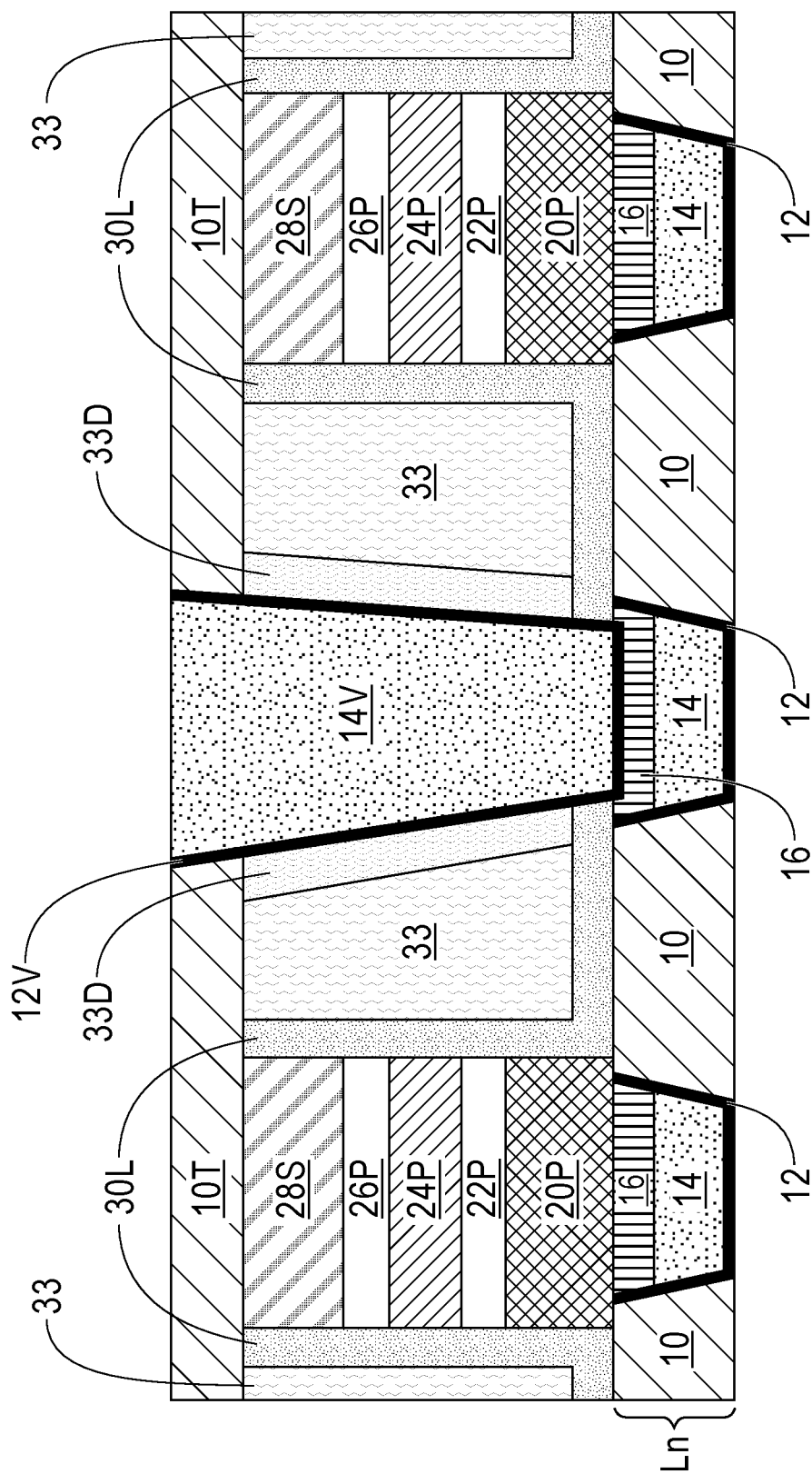
FIG. 10 is a cross sectional view of the exemplary structure of FIG. 9 after forming a via structure in the harden gap fill dielectric material.

Referring now to FIG. 10, there is illustrated the exemplary structure of FIG. 9 after forming a via structure 14V in the harden gap fill dielectric material 33 to make an electrical connection to one of the bottom electrodes 16 and/or one of the electrically conductive structures 14. It is noted that in the drawing, the via structure 14V is formed in a portion of the harden gap fill dielectric material 33 that is in front of the middle MTJ pillar 18P and top electrode structure 28S shown in FIG. 9. A plurality of such via structures 14V can be arranged in a number of geometrical configurations such as in a checkerboard pattern with respect to the MTJ pillars 18P and the top electrode structures 28S, as shown in FIG. 10, or at edges of MTJ pillar arrays. The structure of FIG. 9 can be optionally capped with an ILD film 10T prior to forming the via structure 14V. The ILD film 10T is similar to ILD film 10 and is formed using similar techniques. The via openings used in providing the corresponding via structures 14V are patterned in desired locations away from the MTJ pillars 18P and top electrode structures 28S using suitable lithography techniques. The harden gap fill dielectric material 33 is removed through the via openings using reactive ion etch (RIE). The RIE chemistry can be switched to break through the encapsulation liner 30L after removing harden gap fill dielectric material 33. All or some of the exposed bottom electrode 16 can be also removed. The exposed surface of conductive structures 16/14 is cleaned and a conductive liner 12V is typically deposited into the via opening. The conductive liner 12V is similar to the liner 12 and is formed using similar techniques. The via opening including the conductive liner 12V is then filled with a metallic conductor and planarized to provide via structure 14V. The metallic conductor used in providing the via structure 14V is similar to that of conductive structure 14 and formed using similar techniques. The same via structures may be used to contact the top electrode structures 28S and to wire MTJ pillars 18P into memory arrays. The RIE chemistries employed for forming via structures may contain oxygen producing damaged harden gap fill dielectric material regions 33D adjacent to the via sidewalls. In the damaged harden gap fill dielectric material regions 33D, the oxygen radicals and ions attack organic radical groups replacing them with a hydroxyl group (—OH). It is noted that the harden gap fill dielectric material 33 provides better resistance to these chemical processes reducing depletion of Si—$CH_3$ and Si—H bonding and buildup of —OH bonding in the damaged harden gap fill dielectric material regions 33D as compared to the harden gap fill dielectric material 33. As a result, the via profiles become more vertical with reduced or no via blowout allowing for denser memory.

Without providing any limitation, the implantation step mentioned above results in bond scission (i.e., bond breaking) of the gap fill dielectric material. A moderate degree of bond scission causes the long polymeric chains to break into smaller parts and the bond terminating radicals such as hydrogen, hydro-carbon groups, or amino groups to detach freeing up neighboring dangling bonds to participate in chemically strong bonding chains and crosslinking bonds formed during subsequent curing steps. It should be understood that a certain amount of bond-terminating organic radical groups is required to achieve a low dielectric permittivity k. Accordingly, the implantation dose is selected to keep the resultant dielectric permittivity k below 3.

Without providing any limitation, the laser annealing of the modified gap fill dielectric material and encapsulation material, is performed at a temperature equal to or above about 1000° C. also causes the bond terminating radicals such as hydrogen, hydro-carbon groups, or amino groups to detach freeing up neighboring dangling bonds to participate in chemically strong crosslinking bonds. Detached radicals may diffuse out of the film and desorb from free surfaces long after the laser-induced temperature pulse but some of them can re-attach themselves back to similar bond terminating sites partially negating positive effect of laser-induced dielectric film hardening. In addition, high-temperature laser annealing may increases the likelihood of tying up neighboring dangling bonds caused by either ion implantation or laser annealing itself. Longer annealing duration also increases the likelihood of detaching bond-terminating radicals and tying up neighboring dangling bonds. Advantageously, multiple short-duration laser anneals can be utilized in lieu of a longer annealing duration. Accordingly, 2 to 30 consecutive laser anneals can be utilized to increase a cumulative radiation exposure duration or, equivalently, a cumulative annealing duration by 2 to 30 fold over a single laser anneal. It should be understood that a certain amount of bond-terminating organic radical groups is required to achieve a low dielectric permittivity k. Accordingly, the laser anneal peak temperature and duration is selected to keep the resultant dielectric permittivity k below 3.

Without providing any limitation, the conventional UV-curing step at an elevated substrate temperature of the dielectric material, i.e., the gap fill dielectric material results in the removal of detached terminating radicals and further crosslinking the dangling bonds into chemically strong —Si—O—, —Si—CH$_2$—, —C—O—, and —C—N— crosslinking bonds and chains. The resultant material possesses an increased resistance against oxygen containing plasma. This manifest itself in reduced rate of replacing remaining bond-terminating organic radical groups with hydroxyl groups.

In some embodiments, a conventionally-cured gap fill dielectric material (i.e., an as deposited gap fill dielectric material that has been subjected to a UV cure) has a first resistance to a plasma induced damage and the harden gap fill dielectric material 33 has a second resistance to a plasma induced damage and the second resistance is larger than the first resistance. The plasma induced damage includes exposure to an oxygen-containing plasma. The conventionally-cured gap fill dielectric material exposed to an oxygen-containing plasma has a first hydroxyl content and the harden gap fill dielectric material 33 exposed to an oxygen-containing plasma has a second hydroxyl content and the first hydroxyl content is larger than the second hydroxyl content. The conventionally-cured gap fill dielectric material exposed to an oxygen-containing plasma has a first hydrogen content and a first carbon-hydrogen content and the harden gap fill dielectric material 33 exposed to an oxygen-containing plasma has a second hydrogen content and a second carbon-hydrogen content and the first hydrogen content is lower than the second hydrogen content and the first carbon-hydrogen content is lower than the second carbon-hydrogen content. The conventionally-cured gap fill dielectric material exposed to an oxygen-containing plasma has a first etch rate, and the harden gap fill dielectric material 33 exposed to an oxygen-containing plasma has a second etch rate that is lower than the first etch rate.

In some embodiments, the amount of Si—CH$_3$ bonging or, equivalently, the amount of carbon content in the damaged harden gap fill dielectric material regions 33D is no less than 90% of those respective amounts in harden gap fill dielectric material 33. In some embodiments, the amount of Si—CH$_3$ bonging or, equivalently, the amount of carbon content in the damaged harden gap fill dielectric material regions 33D are essentially the same as in the harden gap fill dielectric material 33. In one embodiment, the carbon content in the damaged harden gap fill dielectric material regions 33D is in excess of 10 atomic % and, preferably, at around 12 atomic %. In some embodiments, the amount of Si—H bonging in the damaged harden gap fill dielectric material regions 33D is no less than half of that amounts in the harden gap fill dielectric material 33.

In other embodiments, the conventionally-cured gap fill dielectric material has a first Young's modulus, and the harden gap fill dielectric material 33 has a second Young's modulus that is greater than the first Young's modulus. In some embodiments, the harden gap fill dielectric material 33 has improved chemical bonding, i.e., less amount of bond terminating radicals such as hydrogen, hydro-carbon groups, and amino groups allowing for stronger framework of —Si—O—, —Si—CH$_2$—, —C—O—, and —C—N— bonding chains at a given low dielectric permittivity k of below 3.

In some embodiments, the harden gap fill dielectric material 33 is composed of a low-k dielectric material that contains atoms of Si, C, O and H. In other embodiments, the harden gap fill dielectric material 33 is composed of a low-k dielectric material that contains atoms of Si, C, O, N and H.

In some embodiments, the as deposited encapsulation material layer 30 has a first hydrogen content and a first nitrogen-hydrogen bonding content and a first carbon-hydrogen bonding content, and the laser annealed encapsulation material liner 30L has a second hydrogen content that is less than the first hydrogen content, and a second nitrogen-hydrogen bonding content that is less than the first nitrogen-hydrogen bonding content, and a second carbon-hydrogen bonding content that is less than the first carbon-hydrogen bonding content. The as deposited encapsulation material layer 30 has a first etch rate, and the laser annealed encapsulation material liner 30L has a second etch rate that is lower than the first etch rate.

In other embodiments, the as deposited encapsulation material layer 30 has a first Young's modulus, and the laser annealed encapsulation material liner 30L has a second Young's modulus that is greater than the first Young's modulus. In some embodiments, the laser annealed encapsulation material liner 30L has improved chemical bonding, i.e., less amount of bond terminating radicals such as hydrogen, hydro-carbon groups, and amino groups allowing for stronger framework of —Si—O—, —Si—N—, —C—N— and —B—N— bonding chains.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a memory structure, the method comprising:
    forming a patterned material stack on a surface of a bottom electrode, wherein the patterned material stack comprises a multilayered magnetic tunnel junction (MTJ) pillar and a top electrode structure;

forming a gap fill dielectric material layer laterally adjacent to, and on top of, the patterned material stack;

ion implanting a bond breaking additive into the gap fill dielectric material layer to provide a modified gap fill dielectric material layer; and curing the modified gap fill material layer to provide a harden gap fill dielectric material layer.

2. The method of claim 1, wherein the curing is performed using an energy source that is provides electromagnetic radiation.

3. The method of claim 2, wherein the curing comprises UV curing.

4. The method of claim 3, wherein the curing further comprises laser annealing.

5. The method of claim 4, wherein the laser annealing is performed prior to the UV curing.

6. The method of claim 4, wherein the laser annealing is performed after the UV curing.

7. The method of claim 4, wherein the laser annealing is performed at an incident laser energy density that is equal to, or less than, 0.4 J/cm$^2$ and for a duration from about 1 nanosecond to about 500 nanoseconds.

8. The method of claim 4, further comprising forming a sacrificial assist layer on the modified gap fill dielectric material layer prior to laser annealing.

9. The method of claim 1, wherein bond breaking additive breaks bonds in the gap fill dielectric material layer and does not negatively impact the MTJ pillar and the top electrode structure.

10. The method of claim 9, wherein the bond breaking additive comprises a light-weight element or molecule selected from hydrogen, helium, nitrogen, carbon, and neon.

11. The method of claim 9, wherein the bond breaking additive comprises nitrogen and the ion implanting is performed at an implantation energy from 1 keV to 40 keV and using an ion dosage from $1\times10^{13}$ ions/cm$^2$ to $3\times10^{14}$ atoms/cm$^2$.

12. The method of claim 9, wherein the bond breaking additive comprises helium and the ion implanting is performed at an implantation energy from 1 keV to 10 keV and using an ion dosage from $5\times10^{13}$ ions/cm$^2$ to $1\times10^{15}$ atoms/cm$^2$.

13. The method of claim 1, wherein the bottom electrode is present on a surface of an electrically conductive structure that is embedded in an interconnect dielectric material layer.

14. The method of claim 1, further comprising forming an encapsulation material layer between the patterned material stack and the gap fill dielectric material layer.

15. The method of claim 1, further comprising removing the harden gap fill material layer and the encapsulation material layer that is present on top of the patterned material stack.

16. The method of claim 1, further comprising forming a via structure in the harden gap fill dielectric material, wherein the forming of the via structure includes a reactive ion etch.

17. The method of claim 16, wherein the reactive ion etch damages the harden gap fill dielectric material that is located laterally adjacent to the via structure.

18. The method of claim 17, wherein the damaged harden gap fill dielectric material has a carbon of no less than 90% of carbon content of the harden gap fill dielectric material.

* * * * *